United States Patent [19]

Lucas et al.

[11] Patent Number: 5,170,132
[45] Date of Patent: Dec. 8, 1992

[54] CHOPPER AMPLIFIER CIRCUIT FOR THE SUPPLY OF A CURRENT PROPORTIONAL TO A VOLTAGE

[75] Inventors: Jean-Christophe Lucas, St Sulpice et Cameyrac; Yves Sontag, Bordeaux-Cauderan, both of France

[73] Assignee: Sextant Avionique, Meudon la Foret, France

[21] Appl. No.: 757,980

[22] Filed: Sep. 12, 1991

[30] Foreign Application Priority Data

Sep. 14, 1990 [FR] France ................... 90 11372

[51] Int. Cl.$^5$ .................................. H03F 3/38
[52] U.S. Cl. ...................... 330/10; 330/207 A
[58] Field of Search ............ 330/10, 51, 207 A, 251, 330/124 R

[56] References Cited

U.S. PATENT DOCUMENTS

| | | | |
|---|---|---|---|
| 3,508,109 | 4/1970 | Congdon | 315/18 |
| 4,346,349 | 8/1982 | Yokoyama | 330/10 |
| 4,390,846 | 6/1983 | Cragfors et al. | 330/10 |
| 4,446,440 | 5/1984 | Bell | 330/10 |

FOREIGN PATENT DOCUMENTS 0082282  6/1983  European Pat. Off. .
0430577  6/1991  European Pat. Off. .

OTHER PUBLICATIONS

IEEE Transactions on Power Electronics, vol. PE-1, No. 1, Jan. 1986; pp. 48-54. G. B. Yundt: "Series-or Parallel-Connected Composite Amplifiers".

*Primary Examiner*—Steven Mottola
*Attorney, Agent, or Firm*—Oblon, Spivak, McClelland, Maier & Neustadt

[57] ABSTRACT

The disclosure relates to fast amplification circuits that are designed to provide an output current of some amperes, proportional to an input voltage, and have a frequency spectrum that may go beyond 1 MHz. A linear amplifier follows the fast variations in the input voltage and gives a load all the output current so long as this current is low. As soon as the output current from the linear amplifier reaches a given value, a chopper amplifier gives a current that causes a reduction in the output current of the linear amplifier. The circuit may be applied, in particular, to the control of deflection coils and as a high efficiency amplification circuit for audiofrequencies.

1 Claim, 2 Drawing Sheets

CHOPPER AMPLIFIER CIRCUIT FOR THE SUPPLY OF A CURRENT PROPORTIONAL TO A VOLTAGE

BACKGROUND OF THE INVENTION

The present invention relates to chopper amplifier circuits for the supply of a current proportional to a voltage and, in particular, it applies to such circuits designed to provide deflection coils of cathode-ray tubes with the currents needed for their operation.

Hereinafter, the circuits referred to shall be mainly amplifier circuits supplying deflection coils in order to carry out a stroke deflection on the screen of a cathode-ray tube, namely a scanning where the beam can travel across the screen in any way. The current supply to the deflection coils then raises crucial problems of energy dissipation. However, the circuit according to the invention can be applied in any field where high power has to be supplied to any load.

Since a deflection coil can be likened to an inductor, the voltage at its terminals has the form L.dI/dt where L represents the inductance of the coil and dI/dt represents the derivative with respect to time t of the current I that flows through the coil. Since the shifting of the beam on the screen is appreciably proportional to I, the term dI/dt may be identified with the speed of the trace on the screen.

In a stroke deflection, when the image to be traced on the screen is charged, namely filled with details, the tracing speed should be high and hence the supply voltages should be relatively high.

Furthermore, the deflection energy needed is of the order of one millijoule. This implies deflection currents of some amperes.

It can thus be seen that the power needed for the working of a random type electromagnetic deflection system is high. Furthermore, since the deflector is reactive, almost all the power consumed is dissipated in the final stage of the amplifier.

As a consequence, it is frequently necessary to dissipate several tens of Watts in the output transistors, and this raises major problems in compact displays.

A known way to achieve this end is through the complementary association, in one and the same chopper amplifier circuit, of a linear amplifier and a chopper amplifier. The chopper amplifier circuit for the supply, to a load, of an output current proportional to an input voltage, then comprises a linear amplifier and a chopper amplifier, the output of which is coupled to the load. The linear amplifier is a power amplifier controlled to supply a current as a function of the difference between the input voltage and a voltage proportional to the output current, and its output is coupled to the load, so that the current that it supplies constitutes a part of the output current. The other part of the output current is given by the chopper amplifier which is controlled as a function of the current given by the amplifier.

In the known chopper amplifier circuits, the control of the chopper amplifier is not done satisfactorily, and the result thereof is low efficiency and difficulties in making these circuits so that they can work at high frequencies.

SUMMARY OF THE INVENTION

The present invention is aimed at circumventing or, at least, at reducing these drawbacks. This is obtained by the provision, through the chopper amplifier, of y a current that causes the reduction, in terms of absolute value, of the current given by the linear amplifier, in doing so only when the output current of the amplification circuit is greater than a given value. Thus, in particular, this approach averts any risk of making a simultaneous supply, from the chopper amplifier, of two currents with opposite directions, and the switching of these currents is facilitated.

According to the present invention, there is provided a chopper amplifier circuit for the supply, to a load, of an output current proportional to an input voltage, comprising a linear amplifier and a chopper amplifier having an output coupled to the load, the linear amplifier being a power amplifier controlled to supply a current as a function of the difference between the input voltage and a voltage proportional to the output current and having an output coupled to the load, so that the current given by it constitutes a part of the output current, the other part of the output current being provided by the chopper amplifier, this chopper amplifier being controlled as a function of the current given by the linear amplifier, the control of the chopper amplifier being achieved by a circuit that comprises measuring and control means for the activation, only when the output current is greater in terms of absolute value than a given value, of the supply by the chopper amplifier of a current that tends to increase the output current in terms of absolute value so as to tend to reduce, in terms of absolute value, the current given by the linear amplifier.

BRIEF DESCRIPTION OF THE DRAWINGS

The present invention shall be understood more clearly and other characteristics shall appear from the following description and from the following figures, of which.

In the different diagrams, the corresponding elements are designated by the same references.

MORE DETAILED DESCRIPTION

Figure 1:
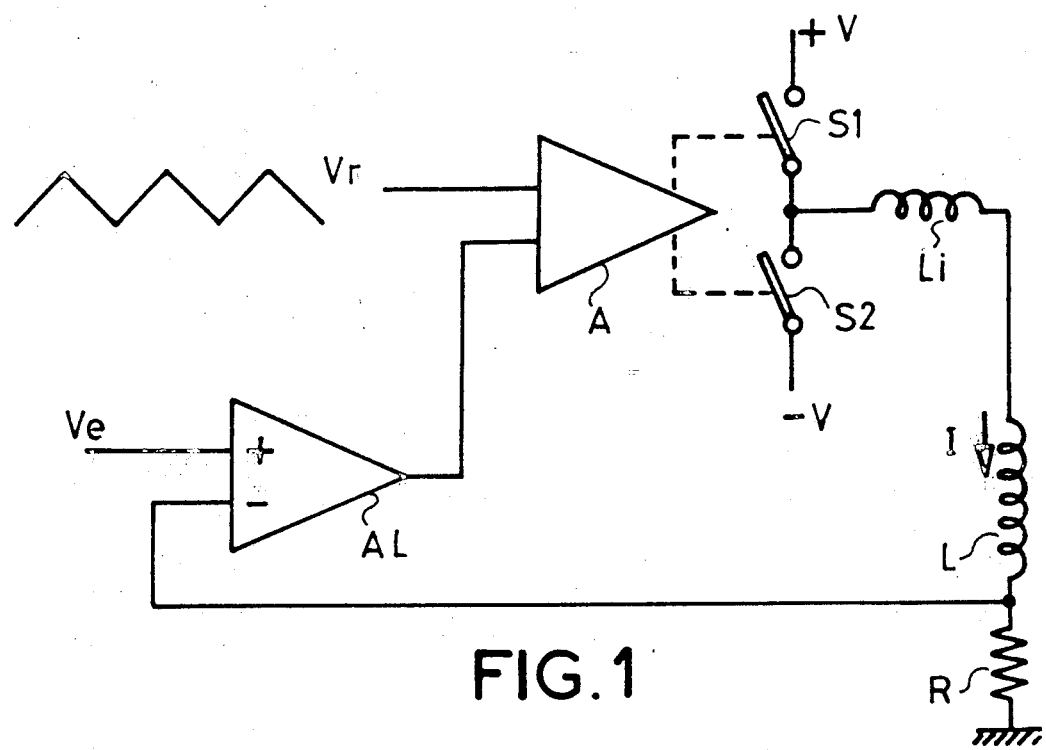
FIG. 1 shows the diagram of a circuit that constitutes a step o the path leading to the invention.

FIG. 1 shows the diagram of an amplifier circuit conceived by the inventor in order to provide a current I in a deflection coil L, as a function of an input voltage Ve, for a cathode-ray tube used in stroke deflection.

The circuit according to FIG. 1 comprises a chopper amplifier, represented schematically by an amplifier A with two inputs and two outputs, and by two switches S1, S2, series-connected between two points to which there are respectively applied two voltages +V and −V. The opening and the closing of the switches S1, S2, which are actually transistors, are activated by the output signals of the amplifier A. The two inputs of the amplifier A respectively receive a chopping signal Vr, and the output signal of a linear differential amplifier AL. At its "+" input, the amplifier AL receives the input voltage Ve. The chopping signal is a sawtoothed voltage signal, with a constant value, that controls the chopping.

The output of the chopping amplifier, namely the common point of the switches S1 and S2, is connected by a smoothing coil Li to the first end of the deflection coil L, the second end of which is connected to the ground by a resistor R and is connected to the "−" input of the differential amplifier AL.

The amplifier AL takes the difference between the input voltage Ve and the voltage at the terminals of the resistor R. The chopper amplifier tends to bring this resistance to zero by causing variation in the value of the current I given to the deflection coil L.

The major drawback of the circuit according to FIG. 1 is the need to do the chopping with a signal Vr, the frequency of which should be twice that of the input signal. Since the frequency spectrum of the input signal is generally greater than 1 MHz for a stroke deflection, it is necessary, in practice, to do the chopping at 4 MHz at list. At such frequencies, the losses by switching become comparable to the losses by conduction in a linear amplifier. Moreover, switching noises, which are difficult to eliminate, pollute the image.

The circuit according to FIG. 1 is thus seen to be unexploitable, at least with the switch transistors presently available in the market.

Since the inductive character of a deflection coil rules out fast variations of the current that goes through it, the speeds of the tracing on the screen are necessarily limited and, consequently, the major part of the spectrum of the current is at low frequency. This is put to good use, in the circuits that shall now be described, to process the low-frequency and high current components by means of a chopper amplifier, the working frequency of which is not higher than the upper frequency of the spectrum to be transmitted, in order that the switching losses may be acceptable. By contrast, the high frequency components of the current in the deflection coil, which are limited in amplitude, are processed by means of a fast but relatively low power linear amplifier.

Figure 2:
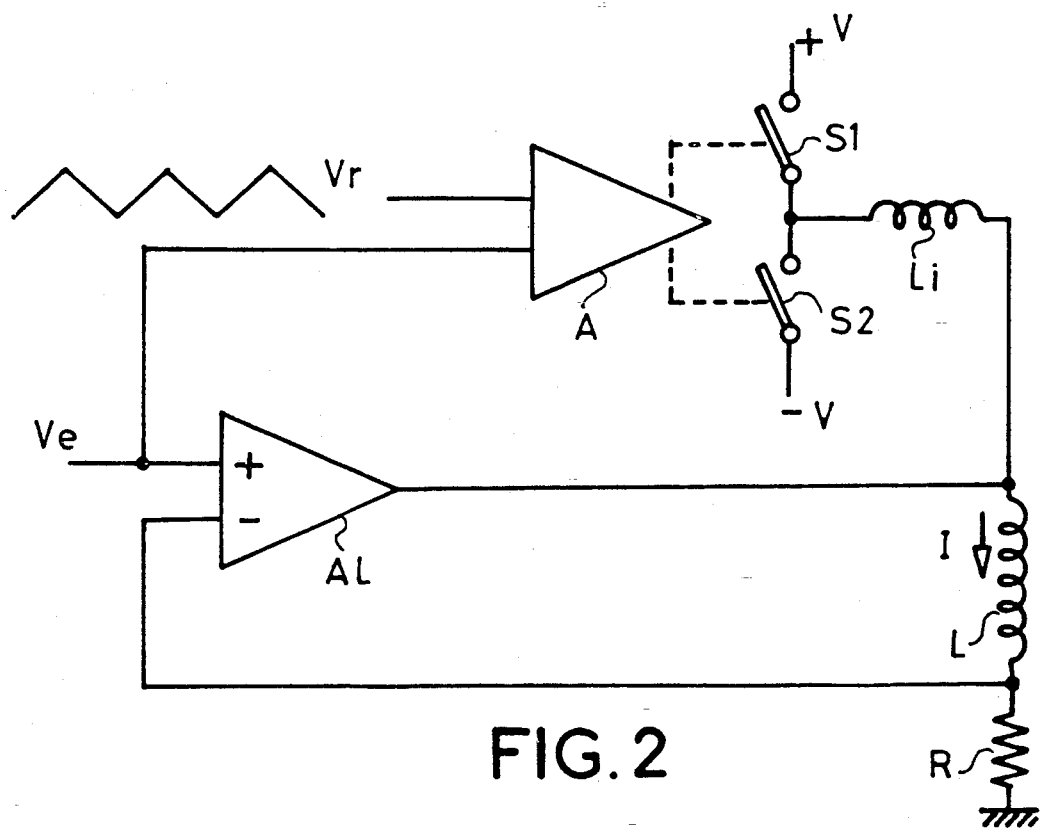
FIGS. 2, 3 and 4 are diagrams of circuits according to the invention.

The diagram of the circuit according to FIG. 2 can be distinguished from the diagram of FIG. 1 by the fact that the output of the linear differential amplifier AL is connected, no longer to one of the inputs of the amplifier A but to the common point of the smoothing coil Li and deflection coil L, and by the fact that the input of the amplifier AL, which received the output signal of the amplifier AL, here receives the input voltage Ve.

The linear amplifier AL has a high gain so as to servo-link the voltage at the terminals of the resistor R, and hence the current I in the coil L, to the input voltage Ve. In this circuit, the chopper amplifier, schematically represented in FIG. 2 by the amplifier A and the switches S1 and S2, gives the major part of the current I of the deflection coil. All that the linear amplifier AL now has to do is to give the complement, and participate in the elimination of the noise generated by the amplifier A.

Figure 3:
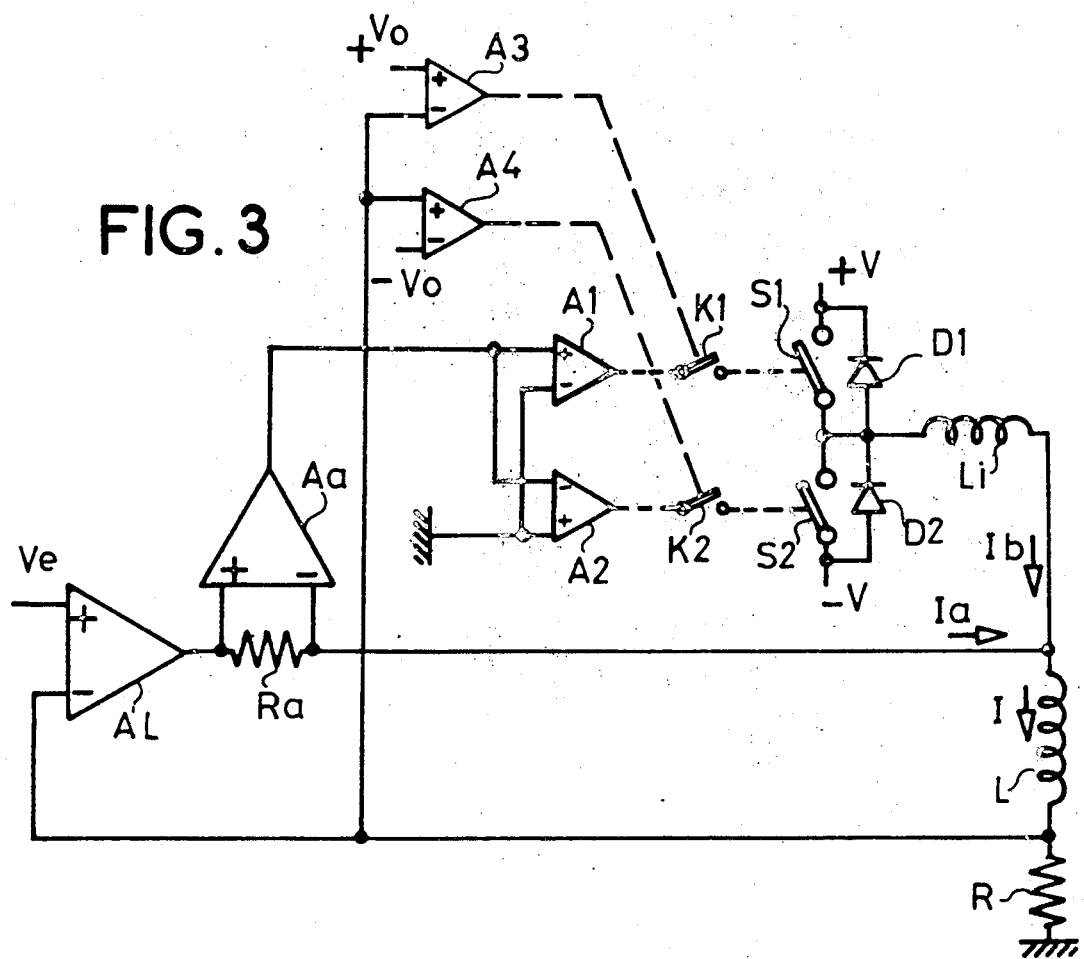

The circuit according to FIG. 2 makes it necessary for there to be an equivalence of gain between the amplifiers AL and A, which is not simple to obtain: this is why the circuit according to FIG. 2 has been modified to arrive at the circuit according to FIG. 3, in which the chopping is controlled directly by the output current of the linear amplifier and in which the chooper amplifier is of the type with natural relaxation, i.e. no longer requiring the sawtoothed signal Vr, as in the circuits according to FIGS. 1 and 2.

The circuit according to FIG. 3 has a linear differential amplifier AL, the "+" input of which receives an input voltage Ve which constitutes the control signal through which a current I, linearly proportional to Ve, has to be provided to a 120-microhenry deflection coil L.

The output of the amplifier AL is connected by a 1-ohm resistor Ra to the first end of the coil L, the second end of which is connected directly to the "−" input of the amplifier AL, as well as to the second input of a standard comparator A3 and to the first input of a standard comparator A4 and, through a 0.5 ohm resistor R, to the ground. The first output of the comparator A3 receives a fixed positive DC reference voltage +Vo and the second input of the comparator A3 receives a voltage −Vo.

The two ends of the resistor Ra are respectively connected to the inputs of a linear operational amplifier Aa, the output of which is connected to the first inputs of two fast comparators A1, A2, the second inputs of which are connected to the ground.

The two comparators A1, A2 form a chopper amplifier with two switches K1, K2, series connected with their respective outputs and with two switches S1, S2 respectively controlled by the output signals of the comparators A1, A2 through the switches K1, K2. This chopper amplifier works in natural relaxation mode as shall be shown hereinafter.

The output signals of the comparators A3, A4 respectively control the switches K1 and K2. It should be specified that, as in the circuits according to FIGS. 1 and 2, the four switches of FIG. 3, which have been shown as simple mechanical contacts, are actually transistors in the example described.

The switches S1 and S2 are series connected between two points respectively connected to fixed DC voltages +V = 40 volts and −V = −40 volts.

Two diodes, D1 and D2, arranged in series, are reverse mounted between the +V and −V voltage points and their common point is connected to the common point of the switches S1 and S2 and to the first end of a 40-henry smoothing inductor Li. The second end of the inductor Li is connected to the first end of the deflection coil L.

Thus made, the circuit according to FIG. 3 gives the coil L a current I that is the sum of the current Ia given by the amplifier AL (it being understood that the amplifier Aa practically takes no current at the output of the amplifier AL) and of the current Ib given by the chopper amplifier.

Since all the current I that goes through the coil L goes through the resistor R, the very high impedance input of the amplifier consumes practically no current, the "−" input of the comparator A3 and the "+" input of the comparator A4, which are also very high impedance inputs, are taken to the potential R.I. Thus, in writing that Vo is the product of the resistance R by a fixed, positive DC current Io, the comparators A3 and A4 respectively compare Vo to R.I and R.I to −Vo, i.e. they respectively compare Io to I and I to −Io. The comparator A3 does not close the switch K1 and therefore does not permit the comparator A1 to act on the switch S1 except when I is greater than Io. The comparator A4 does not close the switch K2 and therefore does not permit the comparator A2 to act on the switch S2 except when I is smaller than −Io. Thus, the chopper amplifier A1, A2, K1, K2, S1, S2 does not provide a current, that is positive or negative, except when I is greater than Io or smaller than −Io, i.e. when $|I| > Io$. The value of Io is chosen to be small. For $|I| < Io$, only the amplifier AL gives current to the coil L and, because this current is low, the efficiency of the amplifier AL does not deteriorate.

The fact that the chopper amplifier does not give current for $|I|<Io$ greatly simplifies the control circuits of the switches S1, S2. Indeed, if not, for I close to 0, it would be necessary to control the two switches S1, S2 almost simultaneously. As a result of this, the two switches S1, S2 would be simultaneously on, and hence there would be a short-circuiting, during very short periods, of the supplies that provide the voltages $+V$ and $-V$, whence a deterioration of the efficiency of the amplifier and an exaggerated fatigue of the transistors S1 and S2.

In the circuit according to FIG. 3, the linear amplifier AL lets through all the low frequency currents so long as they have low amplitude. Then, the chopper amplifier closes that one of the switches S1 and S2 which gives rise to an increase in absolute value of the current I so as to preserve the equation $I = Ia + Ib$, whence a reduction of Ia that leads to an opening of the switch. And, since Ib is then null, Ia increases again and causes the switch to shut. To simplify the description, if we assume that Ve is constant and, hence, that I is constant, a natural oscillation of the chopper amplifier takes place, with the linear amplifier AL compensating for the imperfections of the chopper amplifier which works in all or nothing mode.

The working of the circuit according to FIG. 3 may be described as follows:

for $-Io<I<Io$, i.e. for the low values of I, the amplifier is enough, by itself, to give the current I to the load constituted by the deflection coil L. The comparators A3 and A4 do not close the switches K1, K2 and therefore prevent the comparators A1, A2 from activating the closure of the switches S1, S2. The current Ib is therefore null, and I is equal to Ia.

for $I>Io$, the comparator A3 closes the switch K1 while the switch K2 remains open, so much so that only the switch S1 can close and thus provide the current Ib to the coil L from the supply voltage $+V$. For, since the switch K2 is not closed, there is no risk that the comparator A4 might close the switch S2 and thus permit the supply of current to the coil L from the voltage $-V$. The switch S1 closes so as to supply a current Ib to the deflection coil L to complement the current Ia given by the linear amplifier AL. This closure is therefore done in pace with needs for current complementary to the current Ia, and these needs are measured by means of the amplifier Aa followed by the comparator A1.

for $I<-Io$, the comparator A3 prevents the switch T1 from closing and, this time, it is the switch S2 which, through the supply voltage $-V$, gives the current Ib in pace with needs for current complementary to the current Ia.

It must be noted that, since the variations in the current I in the deflection coil L are relatively slow, the time taken by the current I to go from the value Io to the value $-Io$, or the reverse, is non-negligible. The comparators A3, A4 may therefore be ordinary comparators. This is not so for the comparators A1, A2 for these fast comparators partly determine the duration of the opening and closing of the switches S1, S2 and should therefore react very swiftly to the variations in the current Ia. The comparators A1, A2 should therefore be fast comparators. It must also be noted that when one of the switches S1 or S2 is opened, since the current Ib tends to remain constant owing to the presence of the coil Li, one of the diodes D2 or D1 becomes conductive, the effect of which is to recharge the supplies and hence improve the efficiency.

Figure 4:
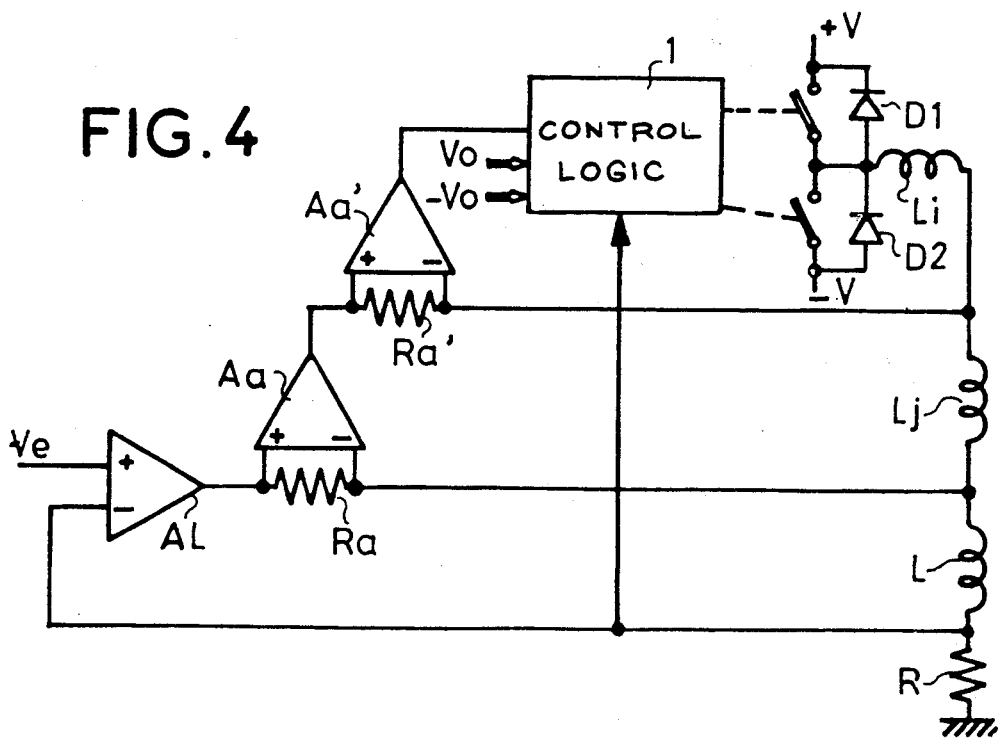

FIG. 4 shows a circuit according to the invention, designed for a very high-definition display on a cathode-ray screen. This figure shows a block 1, called a control logic, that corresponds to the part of the circuit of FIG. 3 including the comparators A1 to A4 and the switches K1, K2. The circuit of FIG. 4 is distinguished from that of FIG. 3 by the addition of a smoothing coil Lj, a linear operational amplifier Aa' and a resistor Ra'. The coil Lj is positioned in series between the coils Li and L. The resistor Ra' is series-connected between the output of the amplifier Aa and the common point of the two smoothing coils Li and Lj. The amplifier Aa' couples the amplifier Aa to the control logic and, to this end, it has its two inputs connected to the ends of the resistor Ra'—this has the effect of doubling the passive smoothing by the coil Lj and the active smoothing by the amplifier Aa.

The present invention is not limited to the examples described which relate to the electromagnetic deflection of an electron beam. It can be applied, for example, to the making of an amplification circuit with improved efficiency for audiofrequencies.

What is claimed is:

1. A chopper amplifier circuit for the supply, to a load, of an output current which is proportional to an input voltage supplied to the chopper amplifier circuit, said chopper amplifier circuit comprising:

a linear amplifier the linear amplifier being a power amplifier controlled to supply a current as a function of the difference between the input voltage and a voltage proportional to the output current, said linear amplifier having an output coupled to the load, so that the current given by said linear amplifier constitutes a part of the output current;

a chopper amplifier having an output coupled to the load and providing the other part of the output current;

a circuit that comprises measuring and control means for the activation of the chopper amplifier only when the absolute value of the output current is greater than a given value; and means for controlling the chopper amplifier as a function of the current given by the linear amplifier, said chopper amplifier supplying a current that tends to increase the output current in terms of absolute value, so as to tend to reduce, in terms of absolute value, the current given by the linear amplifier.

* * * * *